(12) United States Patent
Schmidt et al.

(10) Patent No.: US 7,477,500 B2
(45) Date of Patent: Jan. 13, 2009

(54) METHOD AND SYSTEM FOR SIGNAL AND POWER DISTRIBUTION IN A BUILDING HOUSING A MANUFACTURING PROCESS

(75) Inventors: Stephen James Schmidt, Round Rock, TX (US); Steven C. McCool, Austin, TX (US)

(73) Assignee: NovaCentrix Corp., Austin, TX (US)

( * ) Notice: Subject to any disclaimer, the term of this patent is extended or adjusted under 35 U.S.C. 154(b) by 1042 days.

(21) Appl. No.: 10/955,166

(22) Filed: Sep. 30, 2004

(65) Prior Publication Data

US 2006/0072277 A1    Apr. 6, 2006

(51) Int. Cl.
*H02H 7/00* (2006.01)
(52) U.S. Cl. ....................................................... 361/62
(58) Field of Classification Search .................... 361/62
See application file for complete search history.

(56) References Cited

U.S. PATENT DOCUMENTS 4,596,095 A    6/1986  Chalfant
5,817,981 A *  10/1998 Arroyo ..................... 174/110 N
6,198,047 B1   3/2001  Barr
6,239,379 B1 * 5/2001  Cotter et al. ............. 174/110 R
6,241,920 B1 * 6/2001  Cotter et al. ................ 264/1.24

* cited by examiner

*Primary Examiner*—Stephen W Jackson
(74) *Attorney, Agent, or Firm*—Dillon & Yudell LLP

(57) ABSTRACT

A power and signal distribution system is adaptable to existing building areas and provides a shielded, low resistance and low inductance grounding structure. The distribution system comprises two or more electrically conductive enclosed channels; one for lower current signals and power distribution and one for high current signals and power distribution. The enclosed channels are electrically coupled and are configured as crosses or spokes with branches extending substantially over the length and width of the building area. The earth ground for the building has a direct connection to one of the enclosures. The ground of each device in the building area is directly connected to the enclosed channels by a low impedance connection. Cables are routed through the enclosures and extended to the devices. The walls of the enclosed channels have a thickness that is greater than the skin depth of a predetermined low frequency.

29 Claims, 8 Drawing Sheets

METHOD AND SYSTEM FOR SIGNAL AND POWER DISTRIBUTION IN A BUILDING HOUSING A MANUFACTURING PROCESS

TECHNICAL FIELD

The present invention relates in general to configuring power distribution so that high power signals and power feeds have minimum coupling to low power signals and power feeds.

BACKGROUND INFORMATION

Many facilities and especially laboratories provide some method to ensure signal integrity when they have the occasion to operate high power equipment that uses electronics and sensors for controlling operations. These methods incorporate some forms of power distribution configuration, shielding, transformer isolation, etc., in an attempt to minimize noise and interference. Noise and interference can lower accuracy of measurements or lead to malfunctions especially with electromechanical systems that use low level logic and sensor signals to control operations. Some buildings are constructed with special ground planes that have their own isolated connection to earth ground with a conductive stake or stakes. Instrumentation and low level circuitry is then grounded to this special ground plane to minimize interference from building generated noise (e.g., starting motors or other inductive loads).

When trying to minimize coupling between high power signals and low power signals, it is advantageous to minimize the distance these signals run in parallel and to have the signals only cross at right angles when necessary. Likewise, it is advantageous to carefully construct grounding such that high level currents do not flow through ground traces to which low level circuits are grounded. These high currents generate voltage drops that become noise in the form of ground level voltage shifts. It is very difficult to provide a flexible way to construct facility power distribution so that equipment and control circuitry may be added while maintaining quality low level signal integrity and a high level of isolation from interference between functional units. Normally, modifying a facility with additional equipment essentially requires that the distribution network be likewise modified.

It is often necessary to provide a very low impedance ground path between multiple pieces of equipment. For high current applications (more than 1 kA for example), this means that any current carrying conductors, including a ground bus, must have a large cross-sectional area to keep the resistance between points below a few milliohms. For high frequency pulsed systems, the impedance can be dominated by inductance, so often wide thin conductors are used. Sometimes a thin sheet of copper several feet wide is used for both the shielding and a low impedance ground plane.

The resources expended to minimize signal cross talk in many pulsed power systems can represent a significant fraction of the overall system cost. Low level diagnostic signals are routinely carried by expensive shielded cables. Shielding on these cables is not effective in suppressing very low frequency noise. Specialized systems are implemented to test for the presence of undesirable ground loops. Battery operated isolation amplifiers are sometimes installed in desperation. Despite these efforts, considerable effort is frequently wasted tracking down and reducing unacceptable EMI pickup and low-level signals. With all these competing considerations, the usual result is a rat's nest of bulky cables on the floor and/or traveling across areas where it is necessary for people to walk.

Existing solutions using individually shielded cables, possibly routed through sheet steel enclosed trays, may be adequate for shielding out high-frequency EMI, but they do not have adequate skin depth for low frequencies below several kilohertz. Existing solutions do not address the issue of segregation of high current power cables from low level signal cables and do not provide a low resistance, low inductance star grounding path. Present cable distribution methods do not have good shielding characteristics extending from 50/60 Hz to higher frequencies and do not eliminate cable clutter and trip hazards while providing isolated and segregated shielding for low/high current cables.

There is, therefore, a need for a facility power distribution system that can be added to an existing facility while providing quality signal integrity and a low level of interference between modules that is scalable when adding equipment.

SUMMARY OF THE INVENTION

A facility power distribution system comprises conductive cable enclosures that may be suspended overhead in a facility. The enclosures or cable trays are partitioned into two or more shielded channels depending on the range of power levels of voltages and signals being distributed. The cable trays are single point grounded to the building ground and provide low impedance distributed grounding over the facility area. Signal and power feeds are dropped orthogonal to the cable trays extending connections of high or low power signals to floor level for attachment to equipment. The cable trays are routed to individual equipment areas using right angle grid layouts. Although, a right angle grid layout is described herein because of ease of implementation, other angles could be used. Likewise, the shielded channels may be added above another channel to facilitate signal crossings. Since the power feeds and signal connections drop from the ceiling or rise from the floor underneath or adjacent to equipment, there are no trip hazards and electrical safety is improved as it is less likely a cable shield will be breached.

Embodiments of the present invention simultaneously solve multiple problems presented by existing shielded cable distribution systems. It provides cable distribution to a room full of equipment in a manner that inherently has lower resistance, lower inductance, and is free of ground loops. It provides an ultra-shielded cable enclosure with good shielding characteristics from 50 Hz and above. It eliminates cable clutter and trip hazards. It provides isolated and segregated shielding for low and high current cable groups dramatically reducing EMI pickup and reducing the need for premium individually shielded cables.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

In the following description, numerous specific details are set forth to provide a thorough understanding of the present invention. However, it will be obvious to those skilled in the art that the present invention may be practiced without such specific details. In other instances, well-known circuits and devices may be shown in block diagram form in order not to obscure the present invention in unnecessary detail. For the most part, details have been omitted inasmuch as such details are not necessary to obtain a complete understanding of the present invention and are within the skills of persons of ordinary skill in the relevant art.

The cable distribution system described herein employs channels. Channels are configurations with a length substantially greater than their width. The enclosed channels in the following descriptions are configured to direct the routing of cables from one device to another device or from a source of power to the devices utilizing the power. Channel does not necessarily imply any particular cross-section even though certain cross-sections may be more available and provide desirable features. A channel member with a C-shaped cross-section implies that only a portion of the channel is open. A C-shaped channel is not meant to imply that the channel has any particular curvature to the walls forming the C-shaped channel, rather it implies that the channel is initially open on one side as is the letter "C."

Cable drops are meant to be a generic description of connections that extend from the cable distribution system directly to equipment. In the following description, a cable drop can extend from above or below the equipment depending on whether the cable distribution system is disposed in the ceiling area or below in a raised floor area.

Figure 2:
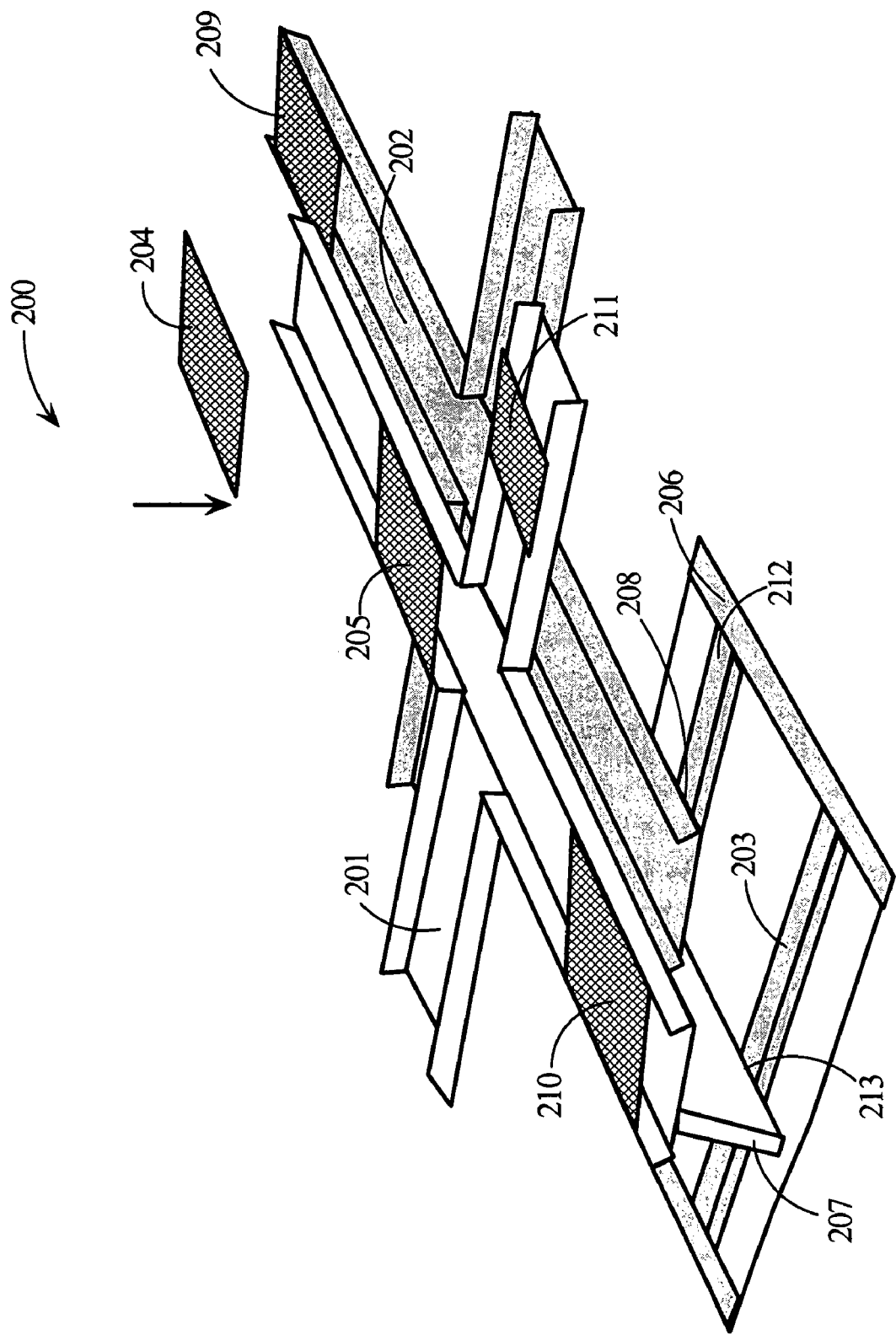
FIG. 2 illustrates two box channels that are offset according to embodiments of the present invention.

FIG. 2 illustrates a two-channel cable tray 200 according to embodiments of the present invention. Each of the two channels are shown in the shape of a cross so that cables may be laid in the channels for distribution of each of two orthogonal axes. While the present description shows orthogonal axes, the channels may intersect at any angle. Structures resembling the spokes in a wheel or including offshoots from a branch could also be employed. Channel 201 is positioned above and laterally offset from channel 202. This allows vertical drops to be coupled to each channel without mechanical interference. Plates 204 and 205 are exemplary plates that provide shielding integrity while allowing access to cables in a channel. A portion of a ladder support 206 is shown with an exemplary support cross member 203. Channel 202 may rest directly on cross members (e.g., 203) while channel 201 has a stand-off 207 that positions channel 201 above channel 202.

Ladder support 206 and channels 201 and 202 are electrically coupled at many locations so they effectively act as one continuous ground structure.

Figure 1:
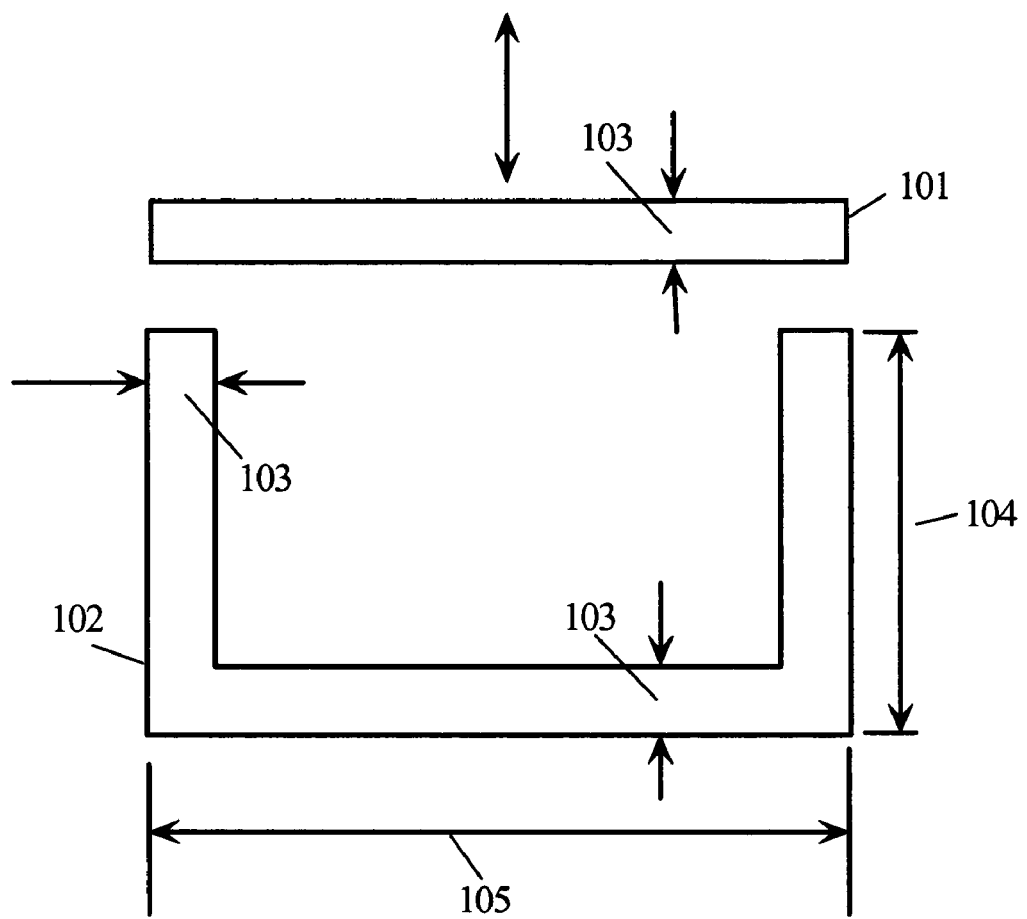
FIG. 1 illustrates a cross-section of a box channel according to embodiments of the present invention.

FIG. 1 illustrates the cross section of channel 201 and a plate (e.g., 204 according to embodiments of the present invention. In one embodiment, channel 201 is fabricated from architectural C-channel with one-quarter thick inch walls, as depicted in FIG. 1, mated to exemplary flat one-quarter inch plates (e.g., plate 204). Channel 201 is completely enclosed with multiple plates 204 and fastened to the channel 201 with wing nuts (not shown in FIG. 1) every few feet. The depth 104 and the width 105 of channel 201 is chosen based on a desired capacity for holding cables considering also any cable overlap in the cross section. The thickness 103 is chosen for shielding effectiveness.

The channel wall thickness 103 and the plate 204 thickness are chosen to be greater than the AC skin depth $\delta$ defined by the equation: $\delta = 1/\sqrt{\pi f \mu \sigma 5}$ where $f$ is the lowest frequency component it is desired to shield against, and $\mu$ and $\sigma$ are the channel wall material magnetic permeability and electrical conductivity, respectively. For aluminum: $\mu = 4\pi \times 10^{-7}$ henrys/m, $\sigma = 3.54 \times 10^7$ mho/m. EMI caused by high current AC inside one tray must penetrate two times the cable tray wall thickness or ½ inch in the present case. For ½ inch thick aluminum, the cut off frequency is 44 Hz, therefore embodiments of the present invention have good shielding down to 50 Hz.

Each cross (illustrated in FIG. 2) is fabricated from multiple lengths of channel (e.g., 201) which are welded to ensure continuous shielding. In the region of intersection, the channels are cut before welding to allow cables to pass through the intersection along either channel. The maximum size of any unshielded penetration through the conducting enclosure must be significantly smaller than the wavelength ($3 \times 10^8$ m /frequency) of the highest frequency electromagnetic wave it is desired to block.

Figure 3:
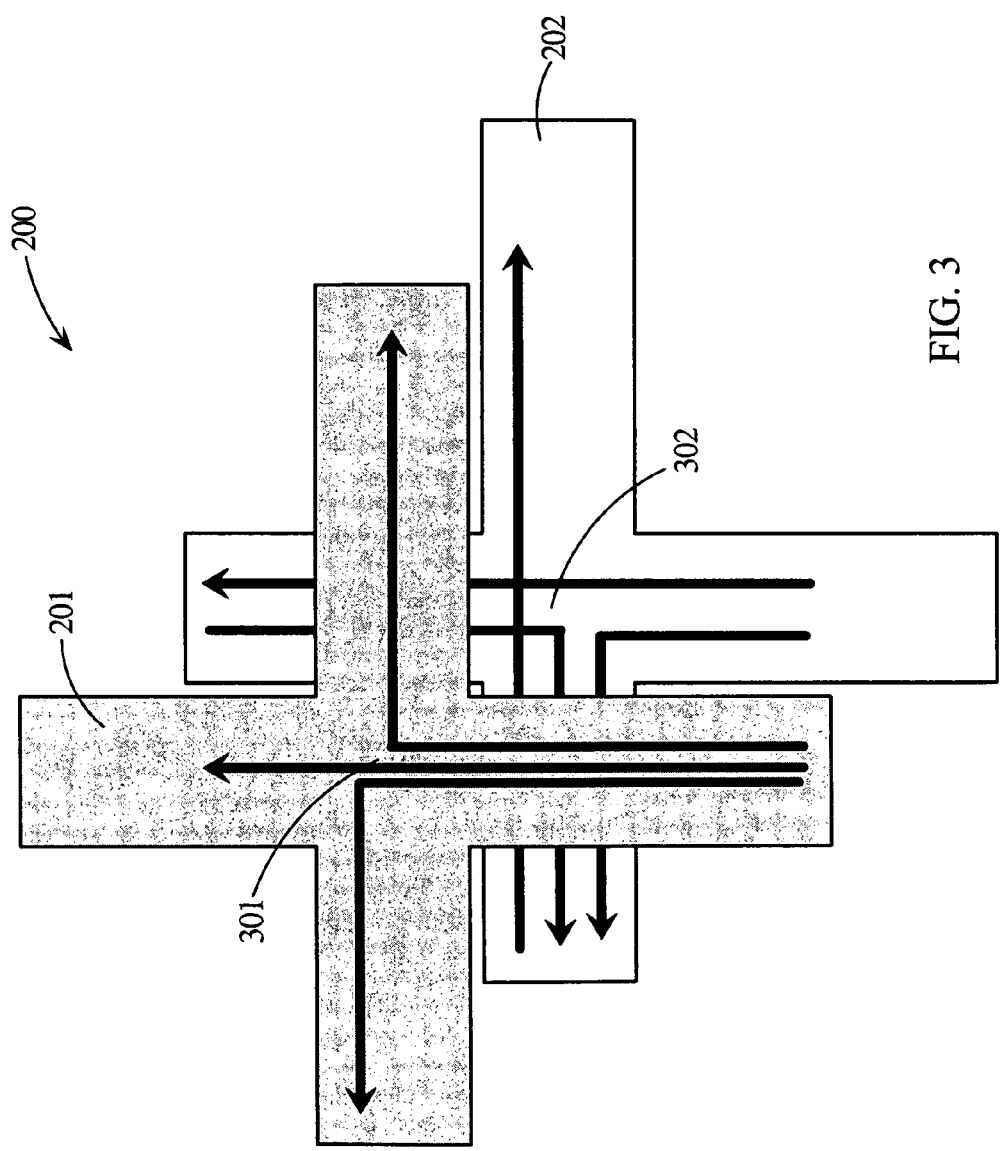
FIG. 3 is a top view of the embodiment of FIG. 2 with access plates removed.

FIG. 3 is a top view of cable tray 200 with cross channels 201 and 202 (illustrated in FIG. 2). Channel 201 is above and offset from channel 202. Cables 301 are shown in various configurations in channel 201 and cables 302 are shown in various configurations in channel 202. In FIG. 3, plates (e.g., 204 in FIG. 2) used to complete the enclosure of cables 301 and 302 are removed so that examples of the cable configurations may be seen.

Figure 4:
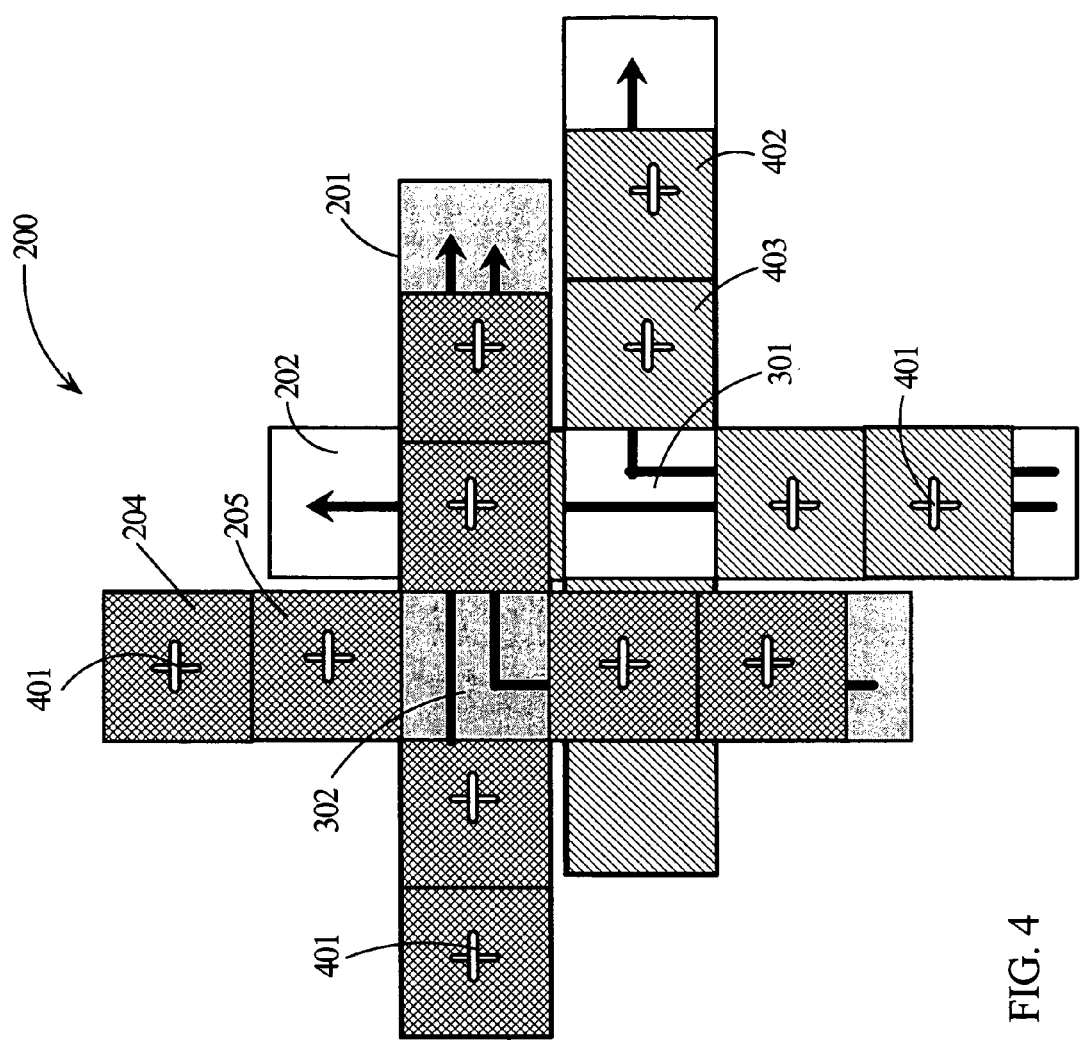
FIG. 4 is a top view of the embodiment of FIG. 3 with selected access plates coupled with wing nuts.
Figure 5:
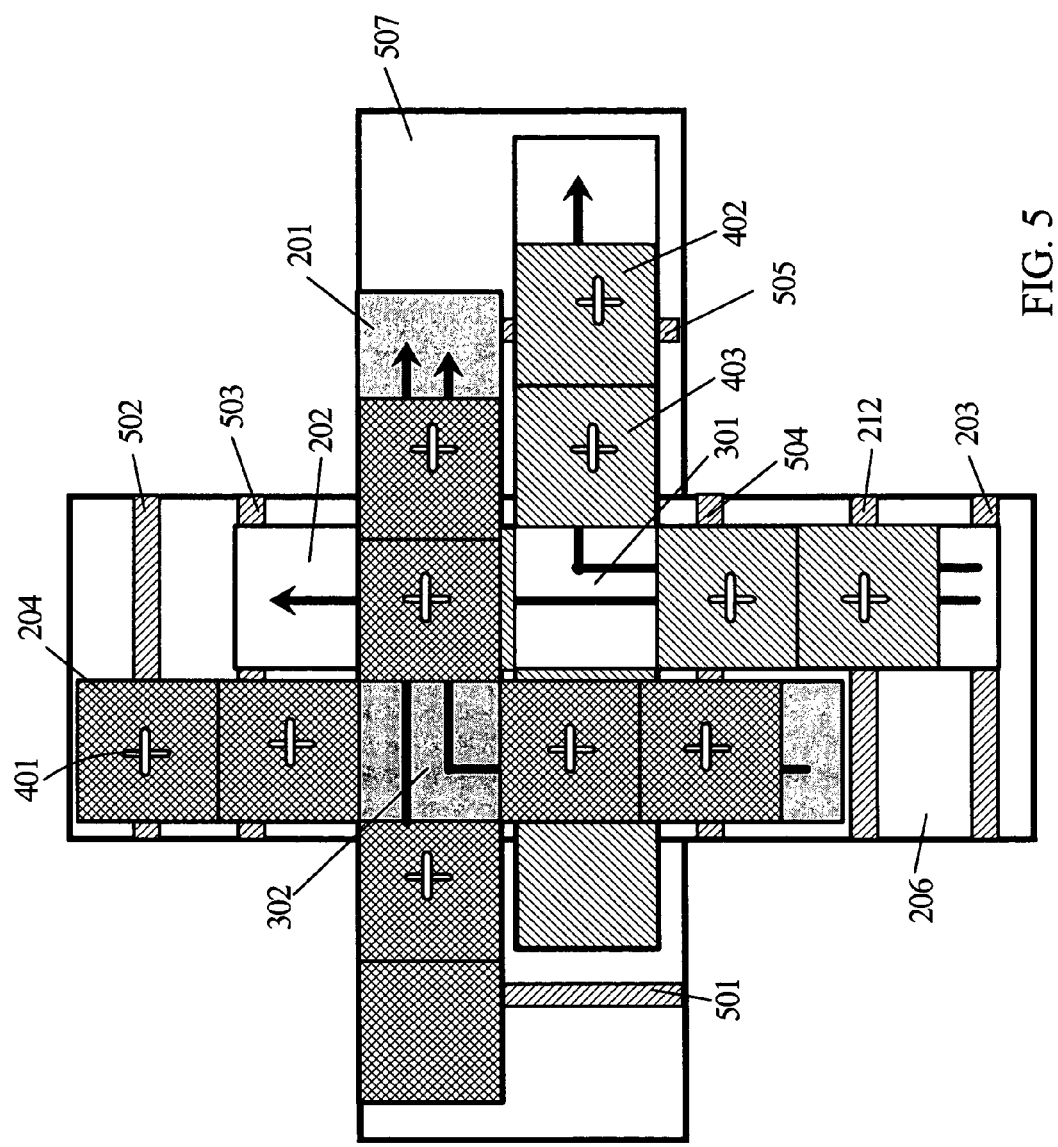
FIG. 5 is a top view of the embodiment of FIG. 3 with portions of a ladder support structure visible.

FIG. 4 is another view of cable tray 200 with cross-channels 201 and 202 with exemplary cover plates 204 and 205 on channel 201 and exemplary cover plates 402 and 403 on channel 202. Wing nuts (e.g., 401) may be used to secure each of the cover plates (e.g., 204) to the C-channels. Completed channels 201 and 202 would be completely enclosed by applying cover plates (e.g., 204) over the entire C-channel; however, some are shown removed in this view so that cables 301 and 302 are visible. Channels 201 and 202 are shown in abbreviated form in the various views in FIGS. 1-6; however, it is understood that they extend in the orthogonal directions to give a desired coverage to an area housing equipment and needing shielded power and signal distribution. The ends of the enclosures are also closed with one-quarter inch thick cover plates to ensure complete shielding FIG. 5 illustrates cable tray 200 with ladder supports 206 and 507. Ladder supports 206 and 507 may be conductive in which case they add to the conductivity of the grounding structure provided by channels 201 and 202 thus lowering the resistance of the structure. Ladder support 206 has cross members 203, 212, and 502-504 shown in this view. Likewise, ladder support 507 has cross members 501 and 505 shown in this view. The cross channels may be mechanically and electrically coupled at each of the cross members. Selected plates (e.g., like 204) are shown removed so that sections of cables 301 and 302 are visible.

Figure 6:
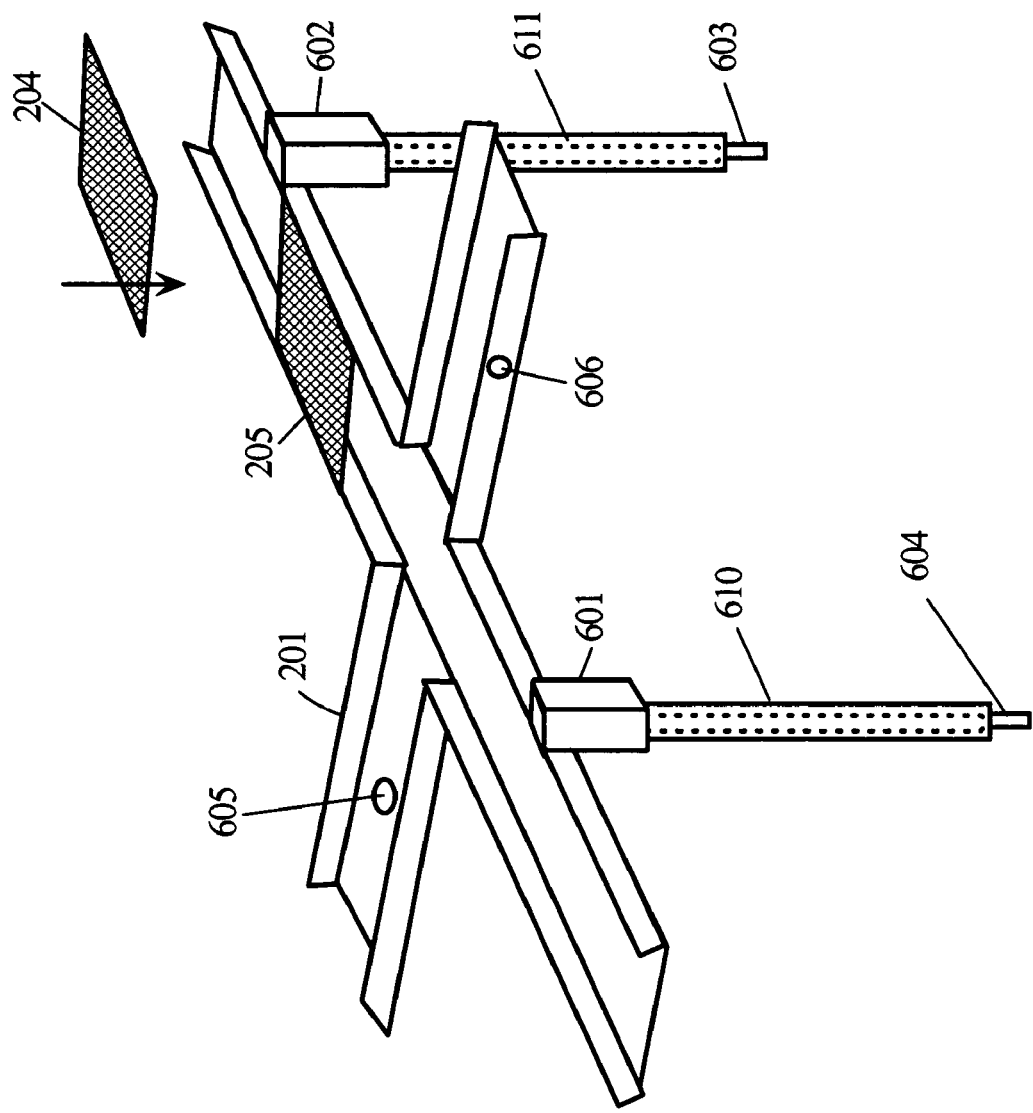
FIG. 6 is a view of a box channel with selected access plates showing access holes and vertical cable drops according to embodiments of the present invention.

FIG. 6 illustrates cable tray 200 with vertical drops to floor level equipment (not shown). Channel 201 is shown with exemplary plates 204 and 205. Side section hole 606 illustrates access routing for cables (e.g., 604 and 603) for side cable drop connections 601 and 602, respectively. The exemplary cable drop connections 601 and 602 are electrically coupled to the side wall channel 201 so as to minimize the size of any nonconductive gap or hole, as large penetrations could limit the high frequency shielding cut-off frequency. This may be combined with conducting elbow-type or other non line-of-sight cable drop connections to further increase the effectiveness of the shielding. The shielding provided by connections 601 and 602 are continued by shielding 610 and 611, respectively. Shielding 603 and 604 normally extend all the way to the device (not shown) to which their corresponding cables (604 and 603) connect. Care should be taken to provide a short interruption in the conductive shielding, if necessary, to avoid ground loops. Alternatively, drops (not shown) that extend from the bottom of channel 201 using an access hole 605 may also be used. Cable drops, for example, the cable drop comprising connection 601, shield 610 and cable 604 may be configured from either rigid or flexible conduit, preferably of conductive material.

Figure 7:
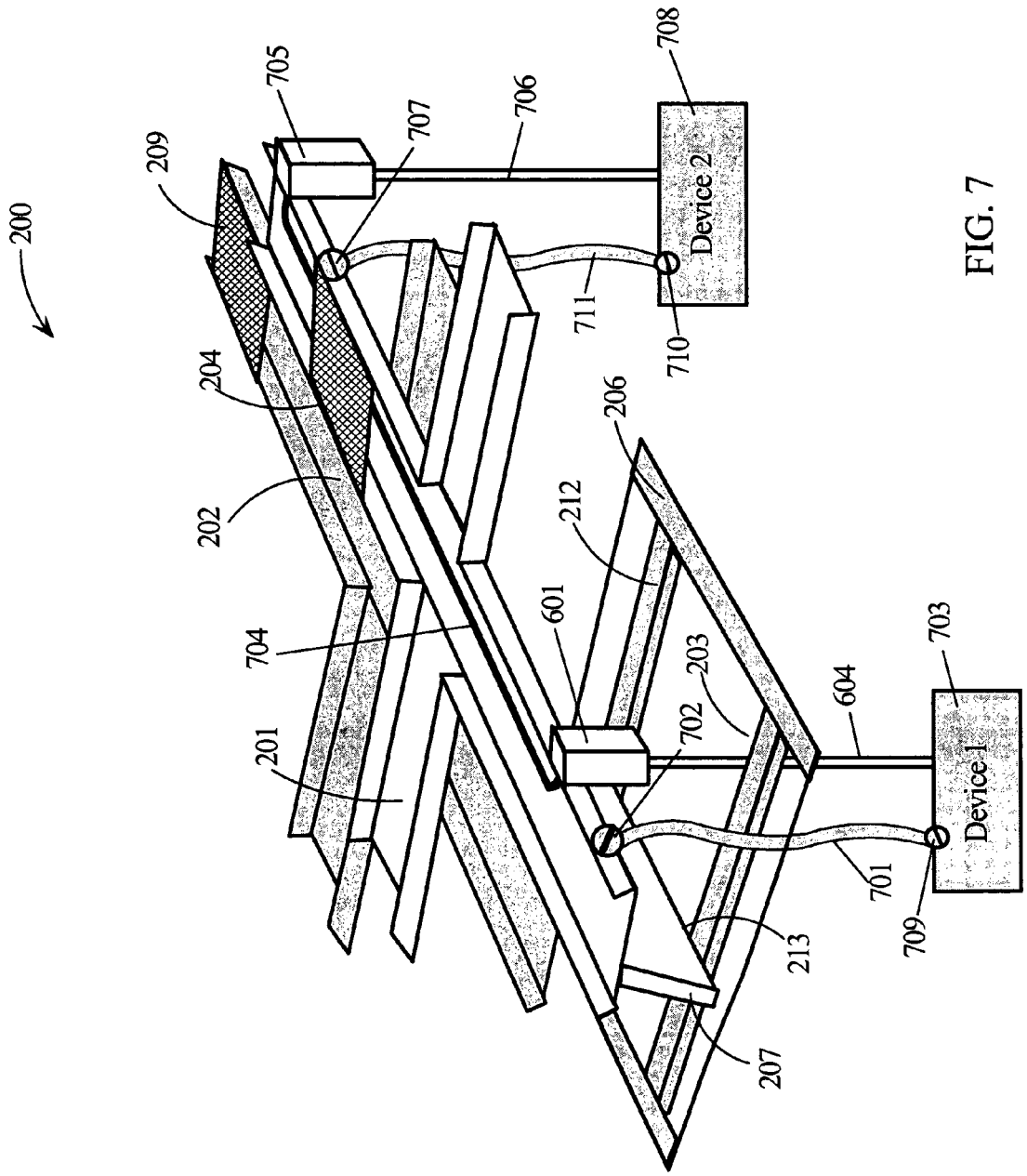
FIG. 7 is another view of two box channels that are offset and showing a portion of a ladder support structure relative to vertical cable drops and ground connections to devices.

FIG. 7 illustrates cable tray 200 with channels 201 and 202 and side cable drop connections 601 for cable 604 and 705 for cable 706. This view illustrates how vertical drops (e.g., cable 604) are routed through the opening between cross members 203 and 212 of a section of ladder support 206 facilitated by offsetting (vertically and laterally). Cross member 203 and 212 mechanically and electrically coupled to support 207 (e.g., with connection 213) on channel 201. A cable 704 is shown routed in channel 201 from device 703 to device 708. The ground 709 for device 703 is coupled with a single vertical wire 701 directly to the wall of channel 201 with connection 702. Likewise, the ground 710 of device 708 is coupled with a single vertical wire 711 to the wall of channel 201 with connection 707. Other devices (not shown) would be coupled in a similar manner using channels 201 and 202 for routing cables.

Figure 8:
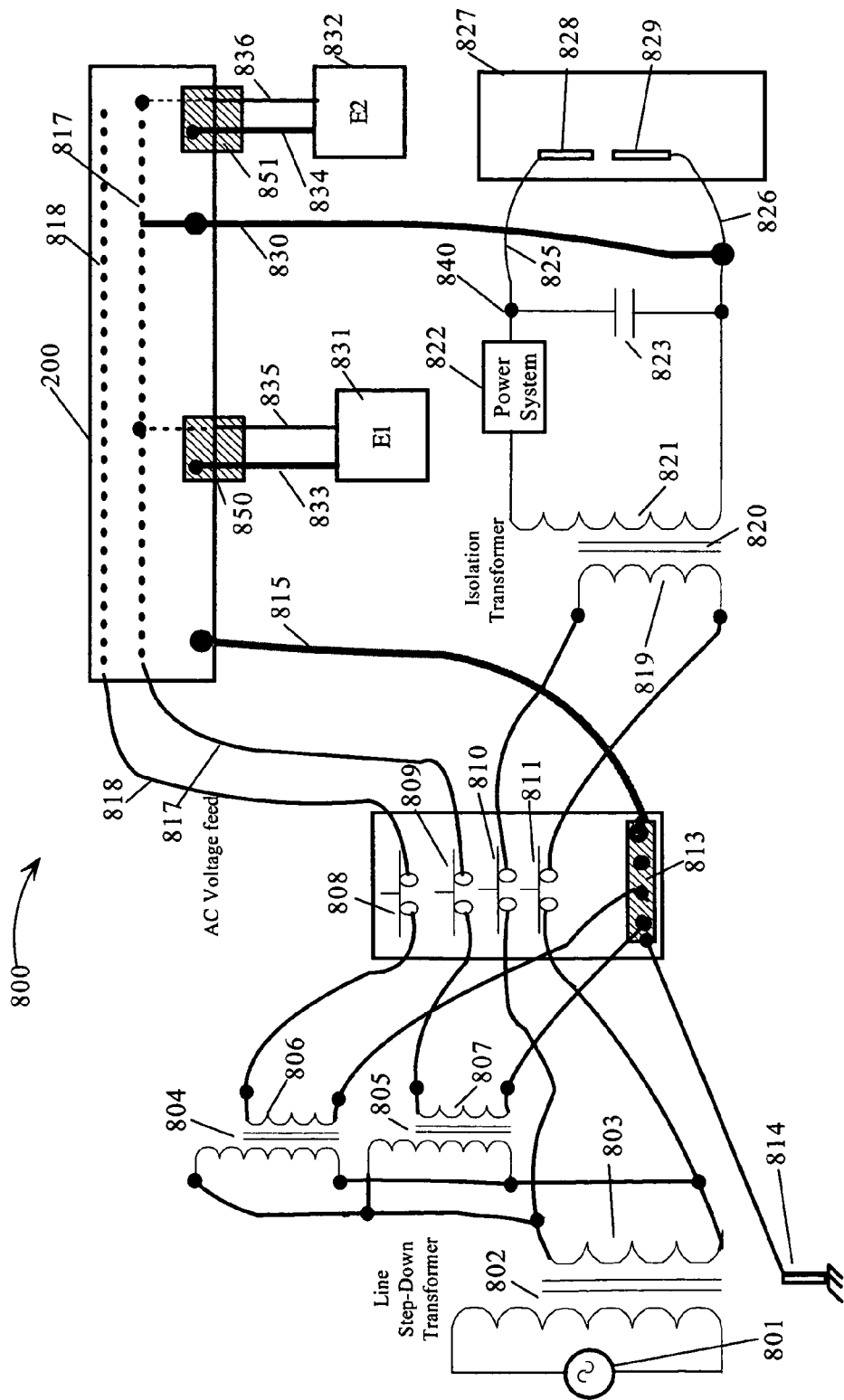
FIG. 8 is a circuit diagram of the line power connection to a building with a power distribution system according to embodiments of the present invention.

FIG. 8 is a circuit diagram illustrating alternating current (AC) power/ground connections using a shielded cable tray according to embodiments of the present invention. An AC source voltage 801 is coupled to step down transformer 802. Source voltage 801 is usually a high voltage feed from the power company providing electrical energy. In one embodiment of the present invention, the secondary 803 of transformer 802 produces a 3-phase 480 volt AC (VAC) output. Only one of the phases is shown in this diagram for simplicity. Secondary 803 is also coupled to the primaries of step-down transformers 804 and 805 which produce an exemplary 220 VAC output at secondary 806 and an exemplary 120 VAC at secondary 807, respectively. One side of secondary windings 806 and 807 are coupled to ground distribution block 813. Ground distribution block 813 is also coupled directly to the power company earth ground 814 which is usually a large copper rod driven into the earth a specified distance. Ground distribution block 813 is also coupled directly to the channels of cable tray 200 at a single point by cable 815. The live voltage side of secondary windings 806 and 807 are coupled through contactors 808 and 809, respectively, forming 220 VAC voltage feed 818 and 120 VAC voltage feed 817. The voltage feeds 817 and 818 are distributed through shielded cable tray 200 to power equipment (e.g., E1 831 and E2 832). Only two voltage feeds are shown in FIG. 8 for simplicity.

When distributing the power feeds (e.g., 817 and 818) care must be taken to ensure that ground loops are not created by power cord ground wires. Exemplary equipment E1 831 and E2 832 are shown coupled to shielded cable tray 200 according to embodiments of the present invention. The ground for exemplary equipment E1 831 and E2 832 are provided by direct cable drops 833 and 834, respectively, that are coupled to a channel of cable tray 200 and extend vertically to exemplary equipment E1 831 and E2 832. Likewise, the power for E1 831 and E2 832 are coupled to exemplary voltage feed 817 in the channels of cable tray 200. The power drops extend through the walls of a channel of cable tray 200 (e.g., connections 850 and 851, which corresponds to connections 601 and 602 as shown in FIG. 6) and drop vertically to exemplary equipment E1 831 and E2 832.

Secondary winding 803 is a phase of 480 VAC for providing power to charge capacitor bank 823. Although transformer 820 is shown as a single phase transformer for simplicity, in embodiments of the present invention, transformers 802 and 820 are 3-phase transformers. Transformer 820 is a step-up transformer generating a high voltage for use in charging capacitor bank 823. Secondary winding 821 is shown generating 2400 VAC; however, other high voltages may be used and still be within the scope of the present invention. Power system 822 represents circuitry used to take the phases of transformer 820 (e.g., winding 821) and generate controlled power output at node 840 for charging capacitor bank 823. The particulars of the circuitry of power system 822 are not needed to explain the present invention which is primarily directed to power distribution and shielding of power and signal lines. The important aspects are the direct ground connections 815, 833, 834 and 830 to the virtual ground "plane" formed by the conductive channels of cable tray 200. Ground connection 815 provides a single point connection for the input. Connections 833 and 834 are exemplary single point ground connections for equipment E1 831 and E2 832 to the channel of cable tray 200. Connection 830 is the single point ground connection of the ground side of second winding 821 as well as capacitor bank 823 to the channel of cable tray 200. Electrodes 828 and 829 are coupled to capacitor bank 823 with connections 825 and 826, respectively. Electrodes 828 and 829 are housed in chamber 827.

The energy stored in capacitor bank 823 is discharged as a large pulsed power event when an arc is struck between electrodes 828 and 829. The ground of capacitor bank 823 is also electrically coupled to "earth ground" through connection 830, the channels of cable tray 200, single point ground connection 815 and distribution block 813. Since the floor of the space housing chamber 827 and cable tray 200 distribution system is also coupled to earth ground, personnel are safe from any hazardous potential building up between the floor and the ground side of capacitor bank 823. Transients that may be caused by the large power spike when capacitor bank 823 is discharged are contained by the grounding scheme and the shielding of cable tray 200 providing a robust and safe high pulsed power distribution system. Likewise, low level control signals are shielded within the channels of cable tray 200 as the power feeds are routed in separate channels wherein the channel wall thickness and geometry prevent cross-coupling.

The cable trays according to embodiments of the present invention comprise two or more box beams arranged in dual cross configurations offset both laterally and vertically. Each cross approximates the spokes on a wheel to provide completely enclosed (shielded) cable availability to the entire room. One cross is reserved for power distribution and high current signal cables. The other cross is reserved for low current and low power signal cables. The current level used to divide high and low currents is chosen for each particular application based on ranges of currents present in various cables used. In one embodiment of the present invention, the dividing point was chosen to be one ampere peak current.

The salient features of cable trays according to embodiments of the present invention are:
1) each channel in the cable tray is completely enclosed (C-channel with removable plate) with electrically conducting walls;
2) preferably the top section of the C channels are removable to allow access to enclosed cables;
3) two or more independent cableways are needed to segregate cables carrying dissimilar ranges of currents; and
4) the geometry of the cableway is conducive to a star grounding configuration and allows multiple cable access (down drops) for arbitrary locations of connected equipment.

Right angle threaded elbows (e.g., 601 and 602) may be used for down drop cable access at convenient locations. Right angles are used to minimize EMI penetration. Other non line-of-sight connections could also be used to minimize EMI penetration. Flexible or rigid shielded conduit may be used for the drops to extend the shielding to near any connected modules or equipment. When multiple cable drops are connected to a single shielded enclosure, electrical breaks in all but one of the conduits may be required to prevent ground loops. Two independent cableways may be mounted at different elevations and offset laterally to allow the two crosses to exist without interfering and allow cable drops from both cable trays and access to all cables in place. The entire structure may be supported by a conventional ladder support that is electrically and mechanically coupled to the channels providing down drop access while decreasing ground distribution resistance. Lugged cables may be bolted to the cable tray to provide individual grounding for equipment modules. An optional fiber-optic distribution system using standard PVC fittings may be attached to the underside of the tray.

The individual cable trays, according to embodiments of the present invention, may be fabricated from any good electrical conductor. The wall thickness is selected depending on the required low frequency skin depth. Any number of separate trays may be used depending on the required shielding between groups of cables. Lateral offsetting of the separate trays provides access to all cables in place; however, it is not essential if the cable penetrations are on the sides and offset. The ground connections may be directed to either cable tray. Cable access holes (cable drop connections) may be made on the sides or the bottom of each channel in the cable tray.

Although the present invention and its advantages have been described in detail, it should be understood that various changes, substitutions and alterations can be made herein without departing from the spirit and scope of the invention as defined by the appended claims.

What is claimed is:

1. A power and signal distribution system extending in an area having a length and width comprising:
a first electrically conductive enclosed channel having intersecting branches for extending over the area in a first plane and having walls of a predetermined thickness greater than a skin depth penetration of a desired low cut-off frequency;
a second electrically conductive enclosed channel having intersecting branches for extending over the area in a second plane and having walls with the predetermined thickness, wherein the first and second planes are offset vertically and the first and second channels are electrically coupled at one or more locations over their corresponding expanse;
one or more cable drops for routing selected cables from within the first and second enclosed channels to devices disposed vertically offset from the first and second enclosed channels; and
a conductor electrically coupled from a ground connection of each of the devices and extending to the first or second enclosed channels, wherein the conductor is electrically coupled to a wall of the first or second enclosed channels.

2. The power and signal distribution system of claim 1, wherein the first and second channels are offset laterally.

3. The power and signal distribution system of claim 1, wherein an earth ground is electrically coupled to a single point of a wall of the first or second enclosed channel.

4. The power and signal distribution system of claim 1, wherein each of the one or more cable drops has a conductive shield fitted over a routed cable and electrically coupled to the wall of the first or second enclosed channel forming a non-interrupted electrical connection, wherein the size of any nonconductive gap or hole between the cable drop and the channel wall is minimized so as not to limit high frequency shielding.

5. The power and signal distribution system of claim 1, wherein the first and second enclosed channels comprise C-shaped channel members each with an open side and one or more plates for coupling over the open side of each of the C-shaped channel members to form the first and second enclosed channels and to provide electromagnetic shielding and to provide access to cables disposed in the first and second enclosed channels.

6. The power and signal distribution system of claim 5, wherein the plates coupled to the C-shaped channel members are each retained by one or more fasteners.

7. The power and signal distribution system of claim 1, wherein the first or second enclosed channels are mechanically coupled to a ladder support structure extending adjacent to the branches of the first and second enclosed channels over an extent of their expanse.

8. The power and signal distribution system of claim 7, wherein the ladder support is electrically conductive and is electrically coupled to the first and second enclosed channels at one or more locations over an extent of the corresponding branches of the first and second enclosed channels.

9. The power and signal distribution system of claim 1, wherein cables having signals and power distribution of a first range of power levels are routed in the first enclosed channel and cables having signals and power distribution of a second range of power levels are routed in the second enclosed channel.

10. The power and signal distribution system of claim 9, wherein the first range of power levels is substantially lower than the second range of power levels.

11. A building having a plurality of building areas each having length and width and housing a manufacturing process employing a system providing high pulsed power and one or more control devices having sensors and low power circuitry for controlling the system providing high power, each of the building areas further having a power and signal distribution system for the manufacturing process extending in the building areas comprising:
a first electrically conductive enclosed channel having intersecting branches for extending over the area in a first plane and having walls of a predetermined thickness greater than a skin depth penetration of a desired low cut-off frequency;

a second electrically conductive enclosed channel having intersecting branches for extending over the area in a second plane and having walls with the predetermined thickness, wherein the first and second planes are offset vertically and the first and second channels are electrically coupled at one or more locations over their corresponding expanse;

one or more cable drops for routing selected cables from within the first and second enclosed channels to devices offset from the first and second enclosed channels; and a conductor electrically coupled from a ground connection of each of the devices and extending to the first or second enclosed channels, wherein the conductor is electrically coupled to a wall of the first or second enclosed channels.

12. The power and signal distribution system of claim 1, wherein the first and second channels are offset laterally.

13. The building of claim 11, wherein an earth ground for referencing a building containing the building area is coupled directly to a single point of a wall of the first or second enclosed channel.

14. The building of claim 11, wherein each of the one or more cable drops has a conductive shield fitted over a routed cable and electrically coupled to the wall of the first or second enclosed channel forming a non-interrupted electrical connection, wherein the size of any nonconductive gap or hole between the cable drop and the channel wall is minimized so as not to limit high frequency shielding.

15. The building of claim 11, wherein the first and second enclosed channels comprise C-shaped channel members each with an open side and one or more plates for coupling over the open side of each of the C-shaped channel members to form the first and second enclosed channels and to provide electromagnetic shielding and to provide access to cables disposed in the first and second enclosed channels.

16. The building of claim 15, wherein the plates coupled to the C-shaped channel members are each retained by one or more fasteners.

17. The building of claim 11, wherein the first or second enclosed channels are mechanically coupled to a ladder support structure extending adjacent to the branches of the first and second enclosed channels over an extent of their expanse.

18. The building of claim 17, wherein the ladder support is electrically conductive and is electrically coupled to the first and second enclosed channels at one or more locations over an extent of the corresponding branches of the first and second enclosed channels.

19. The building of claim 11, wherein cables having signals and power distribution of a first range of power levels are routed in the first enclosed channel and cables having signals and power distribution of a second range of power levels are routed in the second enclosed channel.

20. A method of distributing signals and a plurality of power feeds in a building space housing a system providing high pulsed power to a load and equipment units generating signals for controlling the system comprising the steps of:

forming a plurality of conductive enclosed channels that each extend in vertically offset planes within the building space to positions that are vertically offset from the equipment units and the system providing high pulsed power, wherein walls of the plurality of enclosed channels are electrically connected together at one or more locations and have a predetermined thickness greater than a skin depth penetration of a desired low cut-off frequency;

forming a distribution ground node that is directly connected to a common node of each of the plurality of power feeds and is directly connected to a power company earth ground;

coupling the distribution ground node directly to a wall of one of the enclosed channels with a low impedance cable;

routing cables with low power signals to corresponding equipment units and the system through a first one of the conductive enclosed channels;

routing high power signals and power feeds to corresponding equipment units and the system through a second one of the conductive enclosed channels; and coupling a ground node of the system to a wall of one of the conductive enclosed channels vertically disposed relative to the system.

21. The method of claim 20, wherein the plurality of conductive enclosed channels each comprise C-shaped channel members with an open side and at least one plate for coupling over the open side of each of the C-shaped channel members to form the plurality of conductive enclosed channels and to provide electromagnetic shielding and to provide access to cables disposed in the plurality of conductive enclosed channels.

22. The method of claim 21, wherein one or more plates coupled to the C-shaped channel members are each retained and aligned by one or more fasteners.

23. The method of claim 20, wherein the plurality of enclosed channels are mechanically coupled to a ladder support structure extending vertically adjacent to the branches of the plurality of conductive enclosed channels over the extent of their expanse.

24. The method of claim 23, wherein the ladder support is electrically conductive and is electrically coupled to the plurality of conductive enclosed channels at one or more locations over the extent of the corresponding branches of the plurality of conductive enclosed channels.

25. A power and signal distribution system extending in an area having a length and width comprising:

a first electrically conductive enclosed channel having intersecting branches for extending over the area in a first plane and having walls of a predetermined thickness greater than a skin depth penetration of a desired low cut-off frequency; and a second electrically conductive enclosed channel having intersecting branches for extending over the area in a second plane and having walls with the predetermined thickness, wherein the first and second planes are offset vertically and the first and second channels are electrically coupled at one or more locations over their corresponding expanse.

26. The power and signal distribution system of claim 25 further comprising:

one or more cable drops for routing selected cables from within the first and second enclosed channels to devices disposed vertically offset from the first and second enclosed channels; and a conductor electrically coupled from a ground connection of each of the devices and extending to the first or second enclosed channels, wherein the conductor is electrically coupled to a wall of the first or second enclosed channels.

27. The power and signal distribution system of claim 25, wherein an earth ground for referencing a building containing the building area is coupled directly to a single point of a wall of the first or second enclosed channel.

28. The power and signal distribution system of claim 26, wherein each of the one or more cable drops has a conductive shield fitted over a routed cable and electrically coupled to the wall of the first or second enclosed channel forming a non-interrupted electrical connection, wherein the size of any nonconductive gap or hole between the cable drop and the channel wall is minimized so as not to limit high frequency shielding.

29. The power and signal distribution system of claim 25, wherein the first and second channels are offset laterally.

* * * * *